(12) United States Patent
Nezamfar et al.

(10) Patent No.: US 8,106,715 B1
(45) Date of Patent: Jan. 31, 2012

(54) LOW-POWER OSCILLATOR

(75) Inventors: Bita Nezamfar, Mountain View, CA (US); Srenik Mehta, Union City, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 72 days.

(21) Appl. No.: 12/630,916

(22) Filed: Dec. 4, 2009

(51) Int. Cl.
*H03K 3/03* (2006.01)
*H03L 1/02* (2006.01)

(52) U.S. Cl. ............... 331/46; 331/143; 331/176
(58) Field of Classification Search .......... 331/2, 46–49, 331/56, 111, 143, 150, 153, 176
See application file for complete search history.

(56) References Cited

U.S. PATENT DOCUMENTS

| | | | | | |
|---|---|---|---|---|---|
| 4,325,036 | A | * | 4/1982 | Kuwabara | 331/176 |
| 4,537,515 | A | * | 8/1985 | Dinger et al. | 368/202 |
| 4,577,162 | A | * | 3/1986 | Peterson | 330/253 |
| 4,675,617 | A | * | 6/1987 | Martin | 331/1 A |
| 6,970,022 | B1 | * | 11/2005 | Miller | 327/77 |
| 7,307,485 | B1 | * | 12/2007 | Snyder et al. | 331/150 |
| 7,508,246 | B2 | | 3/2009 | Kase et al. | |
| 7,800,457 | B2 | | 9/2010 | Unkrich et al. | |
| 7,859,421 | B2 | * | 12/2010 | Berthold et al. | 340/653 |
| 2010/0218587 | A1 | | 9/2010 | Stewart | |

* cited by examiner

*Primary Examiner* — Levi Gannon
(74) *Attorney, Agent, or Firm* — Meyertons Hood Kivlin Kowert & Goetzel, P.C.

(57) ABSTRACT

In order to decrease the temperature sensitivity of an oscillator output, and obtain a frequency of oscillation that remains stable over variations in temperature, two oscillators may be configured with identical comparators and logic circuitry, but having different oscillation frequencies. The different oscillation frequencies may be achieved by configuring each oscillator with a respective resistor divider circuit configured to adjust the reference voltage at the reference input of the respective comparator. The difference between the respective periods of oscillation of the two oscillators may therefore become independent of the comparator delay, and may only depend on temperature sensitivity of the resistor. The output of one oscillator may be used to calibrate/adjust the output of the other oscillator based on the difference between the respective periods of oscillation of the two oscillators, due to the difference between the respective periods of oscillation of the two oscillators remaining substantially independent of variations in temperature.

20 Claims, 4 Drawing Sheets

LOW-POWER OSCILLATOR

BACKGROUND OF THE INVENTION

1. Field of the Invention

This invention relates to oscillator design, and, more particularly, to the design of more stable low-power oscillators.

2. Description of the Related Art

Oscillators play a prominent functional role in many analog and digital systems. Typically, oscillators are electronic circuits that convert energy from direct-current sources into periodically varying electrical signals, or voltages. That is, an oscillator typically operates by utilizing the electrical behavior of its circuit elements to convert a steady state input signal into a periodic, time variant output signal. In some implementations the signal produced by an oscillator may be sinusoidal in appearance, such as a sine wave, in other implementations it may appear as a square wave, triangular wave, or a variety of other repeatable signals. Many of today's integrated circuits that require oscillators, such as timer circuits and Phase-Locked Loops (PLLs), need to include the oscillators on-chip in order to meet cost and area requirements. The behavior of such on-chip oscillators is typically affected by the technology used to fabricate the integrated circuit. For example, many widely used fabrication processes today are based on complementary metal-oxide-semiconductor (CMOS) technology, where each specific qualified CMOS process varies slightly from another.

One common type of oscillator is the relaxation oscillator. Typically a relaxation oscillator achieves its oscillating output by charging a capacitor to some event or switching threshold. The event discharges the capacitor, and its recharge time determines the repetition time of the events or switching. Similarly, an oscillating output could also be achieved by discharging instead of charging the capacitor to reach the event or switching threshold. Typically the capacitor is charged through a resistor, with the values of the resistor and the capacitor, which define an RC time constant, determine the rate, or frequency, of the oscillation. For example, decreasing the value of the resistor may increase the oscillation frequency, and increasing the value of the resistor may decrease the oscillation frequency. Typical relaxation oscillators whose frequency is determined by an RC time constant may be prone to temperature and voltage supply variations, since the resistor(s) and capacitor(s) (corresponding to the RC time constant) are temperature dependent, as well as supply dependent with the amplitude of the signals typically affecting the oscillator frequency.

Other corresponding issues related to the prior art will become apparent to one skilled in the art after comparing such prior art with the present invention as described herein.

SUMMARY OF THE INVENTION

In one set of embodiments, in order to decrease the temperature sensitivity of an oscillator output, two oscillators may be configured with identical comparators and logic circuitry, but having different oscillation frequencies. The difference between the respective periods of oscillation of the two oscillators may therefore become independent of the comparator delay. In one set of embodiments, the output of one oscillator may be used to calibrate the output of the other oscillator, due to the difference between the respective periods of oscillation of the two oscillators remaining independent of variations in temperature.

A single oscillator system may include many different components that do not necessarily correlate with each other. For example, logic and comparator delay, and delays due to RC may not correlate with each other. By using two oscillators, the error contribution by most of the parameters that change with respect to temperature may be eliminated, leaving only the temperature sensitivity of the resistors and capacitor as a contributing factor. The temperature coefficient of the entire LPO (low-power oscillator) circuit may therefore become more predictable, and more controllable. The output of one LPO may be used as the desired oscillator CLK output, while the output of the other LPO may be used to accurately correct that output as it is changing with temperature.

Frequency stability of the oscillator may therefore be established with respect to temperature, through establishing and using a temperature-stable difference in period between the two LPO outputs. In other words, the difference between a clock output of a first LPO and a clock output of a second LPO may be temperature independent. The architecture of both LPOs may be the same, and both LPOs may be configured with identical components, with the exception of two respective divider resistors, which may be used to adjust the respective references for the oscillators. The temperature stable difference in oscillation period between the two LPOs may then be used for a variety of purposes. For example, it may be used to implement stable low-frequency timekeeping.

Power consumption may be reduced such that the two oscillators consume less power together than a single oscillator optimized through prior art methods. Benefits also include relaxed requirements for certain circuit elements. The different output periods may be obtained by moving the threshold on the reference input to the comparator configured in the LPO, as opposed to having different input capacitor and feedback resistor values for the two oscillators. In other words, the value of the feedback resistor (to the oscillator input) may be the same for both oscillators, and the value of the input capacitor may be the same for both oscillators, while the two oscillators have different oscillation periods (frequencies). This may result in the comparators triggering at different levels, and the difference in period between the two LPO output signals may be obtained by changing the effective value of the reference node of the comparator, thereby causing the two comparators to flip at different times with respect to each other.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

In various embodiments, a low-frequency/low-power oscillator may be used for tracking time, for example during sleep mode of a system or an integrated circuit (chip). The oscillator may be operated during normal mode to indicate to the chip when to wake up, and may also be operated to provide timing in case the chip wakes up due to an external interrupt. In some embodiments, the oscillator may also provide a clock—of possibly different frequency than the frequency during normal operation—during sleep mode. The maximum allowed frequency drift of the oscillator over time may be determined by the maximum allowed time-error for calculating the wake up time. Power consumption of the oscillator may also affect the overall power consumption of the chip/system, making it desirable to design an oscillator having low power consumption.

Figure 1:
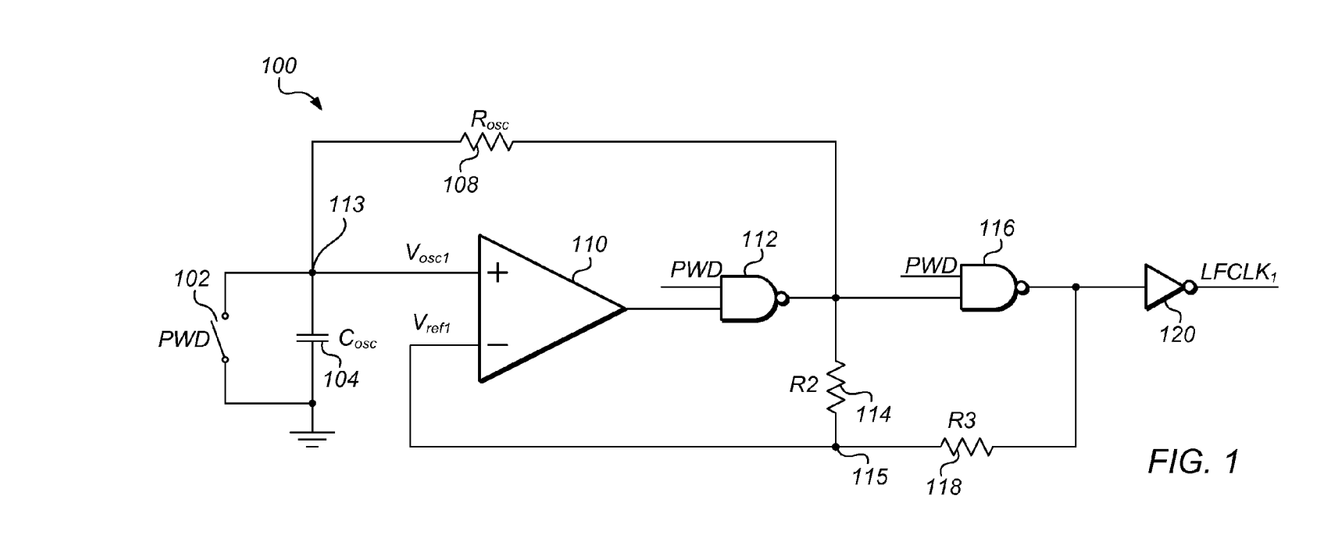
FIG. 1 shows the circuit diagram of one embodiment of a first oscillator.

One possible design of a low power oscillator (LPO) 100 is shown in FIG. 1. In one embodiment, LPO 100 may be manufactured using 0.13 µm technology process. In another set of embodiments, LPO 100 may be manufactured using a 65 nm technology process, while the temperature sensitivity of LPO 100 may also be improved by at least a factor of 2, as will be further shown below. In most prior art designs, a tradeoff has to be made between power consumption and the stability of the oscillation frequency with respect to temperature. In other words, the oscillation frequency may change as the system/chip temperature changes, and an increase in stability of the oscillation frequency over changing temperature would require higher power consumption, or, lower power consumption would result in less stable oscillation frequency over changing temperatures. In one set of embodiments, a new system and method for designing an LPO may facilitate increased stability of the oscillation frequency without increasing the power consumption of the LPO.

Referring again to FIG. 1, LPO 100 may be built around a comparator 110 having a reference input 115 based on the unbuffered output of LPO 100, which may be passed through inverter 120 to provide the clock output $LFLCK_1$ of LPO 100. In one set of embodiments, a switch 102 may be operated using a powered-on signal PWD, enabling LPO 100 when the PWD signal is deasserted. When asserted, PWD signal may also operate to force the output $LFLCK_1$ of LPO 100 to a set value via NAND gates 112 and 116. When PWD is deasserted, NAND gates 112 and 116 each operate as inverters. When PWD is asserted, the respective outputs of NAND gates 112 and 116 are held low, setting the output $LFLCK_1$ high. Alternate embodiments may be configured with different powered-on circuitry. The oscillation frequency of LPO 100 may be a function of the $R_{osc}C_{osc}$ time constant, with resistor 108 and capacitor 104 configured as shown. The oscillation frequency may further be a function of the configuration logic delay ($T_{Logic}$) and comparator delay ($T_{Comp}$). The time period ($T_{osc}$) corresponding to the oscillation frequency of LPO 100 may be expressed as:

$$T_{osc}=2T_{Comp}+2T_{Logic}+aR_{osc}C_{osc}, \quad (1)$$

where 'a' is a function of low and high reference voltages for comparator 110, generated by the resistor divider comprising resistors 114 and 118. The temperature coefficient of the LPO may be a function of temperature sensitivity of all these delays. The logic delay may constitute a small part of the overall delay. However, the delay in comparator 110, and the resistor values may all change with temperature, and may consequently change the frequency of oscillation. In order to decrease the overall temperature dependency, the power of the comparator may be increased to speed up the comparator and decrease its overall delay contribution. For example, from a total of 14 µA of current for a typical process corner case for LPO 100, 12 µA may be consumed in the comparator to achieve this goal. Temperature sensitivity of −300 ppm/C to 250 ppm/C may be achieved over different process corners.

Temperature Sensitivity of Different Components

Different process technologies may result in different temperature coefficients of nPoly and pPoly resistors. The overall resistance may be expressed as:

$$R=R_0(1+T_{C1}(T-T_0)+T_{C2}(T-T_0)^2), \text{ where } T_{C1}<<T_{C2} \quad (2)$$

where $R_0$ is the initial resistance, $T_0$ is the initial temperature, and $T_C$ corresponds to the temperature coefficient. For example, in a 65 nm process, the resistors may cause around 150 ppm per degree C. change in oscillator frequency, or they may cause less change if nPoly and pPoly resistors were combined. If the delay of comparator 110 changes in the same direction over temperature as that of the resistor(s), the sensitivities may add and increase the overall sensitivity. However, if they change in the opposite direction, they may cancel each other out and improve the overall temperature sensitivity. A metal capacitor (i.e. a capacitor structure configured using metal layers) may remain stable with respect to temperature. Temperature sensitivity of MOS capacitors is typically small. For example, simulations may indicate around 70 ppm per degree change in core device MOS capacitors, and −120 ppm per degree change in native-io MOS capacitors. The temperature sensitivity of comparator 110 may depend on the change in threshold and mobility of nMOS and pMOS transistors in the specific technology in which comparator 110 has been manufactured. It may also depend on the comparator bias.

Two Oscillator Design Methodology

Figure 2:
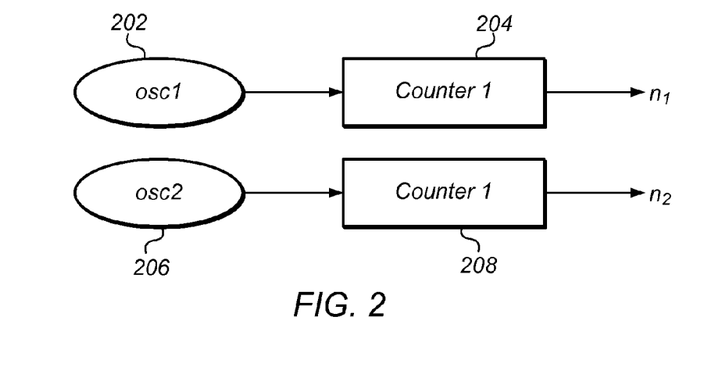
FIG. 2 shows a system diagram of one embodiment of a two-oscillator system.
Figure 3A:
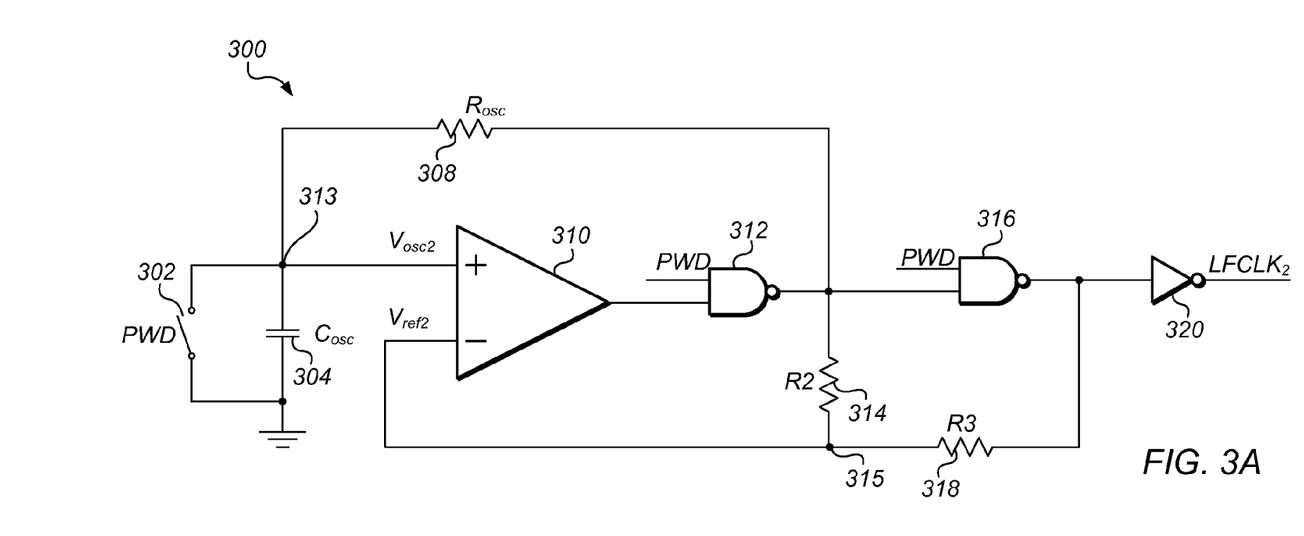
FIG. 3A shows the circuit diagram of one embodiment of a second oscillator used with the first oscillator in the two-oscillator system shown in FIG. 2.

Based on LPO 100, the bottleneck in reducing temperature sensitivity and power consumption may be comparator 100. In order to decrease temperature sensitivity, two oscillators may be configured with the same comparator and same logic circuitry, but different oscillation frequencies. In this way, the difference in the oscillation period of the two oscillators may be independent of the comparator delay. FIG. 2 shows the basic concept where oscillators 202 and 206 may be used to operate counters 204 and 208, respectively, where oscillator 202 has a different oscillation frequency than oscillator 206, while both oscillators may be constructed using identical comparators and logic circuitry. FIG. 3A shows a second LPO 300, which may be identical to LPO 100 with the exception of the value of resistors R2 and R3, represented as resistors 114 and 118, respectively, in LPO 100, and resistors 314 and 318, respectively, in LPO 300. The choice of the values for resistors R2 and R3 in each LPO will be further discussed below.

The respective time periods corresponding to the respective oscillation frequencies of LPO 100 (referenced by subscript '1') and LPO 300 (referenced by subscript '2') may be expressed by the following equations:

$$T_1 T_{osc1} = a R_{osc} C_{osc} + 2 T_{comp} + 2 T_{Logic} \qquad (3)$$

$$T_2 = T_{osc2} = b R_{osc} C_{osc} + 2 T_{comp} + 2 T_{Logic}. \qquad (4)$$

The difference between the two periods may then be expressed as:

$$\Delta T = (T_1 - T_2) = (a-b) R_{osc} C_{osc}. \qquad (5)$$

Assuming the capacitor value ($C_{osc}$) is fairly constant, temperature sensitivity of $\Delta T$ may be equal to the temperature sensitivity of the resistors ($R_{osc}$). As long as the comparator has the same delay in both of the oscillators—i.e., comparator 110 has the same delay as comparator 310—its stability with temperature or its delay contribution may become unimportant. Therefore, this method may significantly reduce the requirements on comparators 110 and 310, and low-speed low-power comparators may be used for comparators 110 and 310. In one set of embodiments, the respective architectures of comparator 110 and 310 may be the same to ensure the logic delay and the comparator delay is the same for both oscillators. This may result in a fairly constant period difference $\Delta T$, which may then be used to track the output of at least one of the oscillators, ensuring that the oscillation frequency of the tracked output is substantially constant. Various embodiments may be configured with different methods to use the constant $\Delta T$ to generate a stable frequency output for one of the LPOs (either LPO 100 or LPO 300).

In other words, a single oscillator system may include many different components that do not necessarily correlate with each other. E.g., logic and comparator delay, and delays due to RC may not correlate with each other. By using two oscillators, the error contribution by most of the parameters that change with temperature may be eliminated, and only resistor sensitivity may need to be accounted for. The temperature coefficient of the entire LPO circuit may therefore become more predictable, and more controllable (lower sensitivity). The output of one LPO may be used as the CLK output, while the output of the other LPO may be used to correct that output as it is moving with temperature.

Circuit Design of Two Oscillators

Figure 3B:
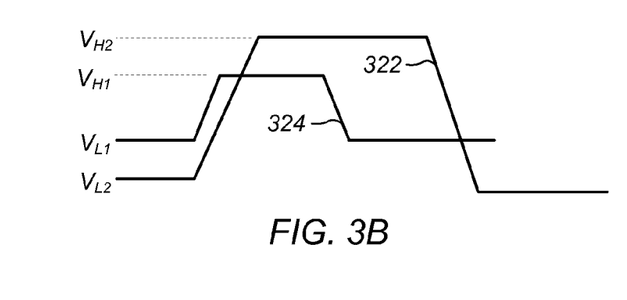
FIG. 3B shows voltage diagrams representative of the respective reference-node voltages for the respective comparators included in the first oscillator and the second oscillator.

While the respective oscillation frequency of each LPO (LPO 100 and LPO 300) may be determined by the respective values of $R_{osc}$ and $C_{osc}$, in order to maintain the same logic design in both LPOs, different oscillation frequencies for the two LPOs may be generated by providing different respective reference voltages for comparators 110 and 310, using different resistor divider ratios. Thus, in LPO 100 the values of R2 (114) and R3 (118) may be different than the values of R2 (314) and R3 (318) in LPO 300. In one set of embodiments, comparators 110 and 310 may be designed to not be sensitive to the common mode voltage of the input, having a constant delay for different reference voltages. FIG. 3B shows one example of the reference voltages 324 and 322 that may be generated at reference inputs 115 and 315, respectively, for LPO 100 and LPO 300. As an example, LPO 100 may be configured as a higher frequency oscillator, with R2 (114) having a value of 9R, and R3 (118) having a value of 10R (R representing a specified unit resistance value), with a low reference voltage threshold of 570 mV ($V_{L1}$) and a high reference voltage threshold of 630 mV ($V_{H1}$) as show in reference voltage waveform 324. On the other hand, LPO 300 may be configured as a lower frequency oscillator, with R2 (314) having a value of 8R, and R3 (318) having a value of 11R (R again representing the specified unit resistance value), with a low reference voltage threshold of 500 mV ($V_{L2}$) and a high reference voltage threshold of 700 mV ($V_{H2}$) as show in reference voltage waveform 322.

The comparator in both LPOs may be configured overall to work with an input common mode range of 500 mV to 700 mV. It should be noted that increasing $R_{osc}$ and/or $C_{osc}$ may not be a desirable or preferred method to change the frequency of either oscillator, since the slope of the oscillation node ($Vosc_1$ 113 and $Vosc_2$ 313) may be different in the two cases, in which case the delay contribution of the comparator would be different. This difference becomes significant since it affects tracking of the periods of the two LPOs when temperature changes. Hence, the oscillation frequency of each LPO may be determined by the respective values of the respective $R_{osc}$ and $C_{osc}$ of the LPO, plus the respective values of the respective R2 and R3 of the LPO, where the respective $R_{osc}$ and $C_{osc}$ values of LPO 100 are the same as the respective $R_{osc}$ and $C_{osc}$ values of LPO 300.

Comparators

In one set of embodiments, each oscillator may be configured with a clockless, low-power comparator. Various different gain stages may be considered for the comparator. Various factors may be taken into consideration when designing comparators 110 and 310. One factor may be good DC common-mode rejection. Since the reference voltage (voltages at nodes 115 and 315, respectively) may change over a wide range (500 mV-700 mV), low threshold transistors may be used. The length of tail current source may also affect the common-mode rejection. While schematic simulations provide a positive indication for a length of 1 µm for a tail current source, the indication provided by LPE (post layout extracted netlist) simulations is not similarly positive at certain process corners. In one set of embodiments, the width and length of the current source may be doubled to improve the results. Furthermore, the comparator may be configured such that as long as the offset is constant with temperature, the first order static offset of the comparator may not affect the results. The (transistor) devices may therefore be sized to be large enough that the sigma of offset is less than a specified value, for example less than 5 mV in some embodiments.

Figure 4A:
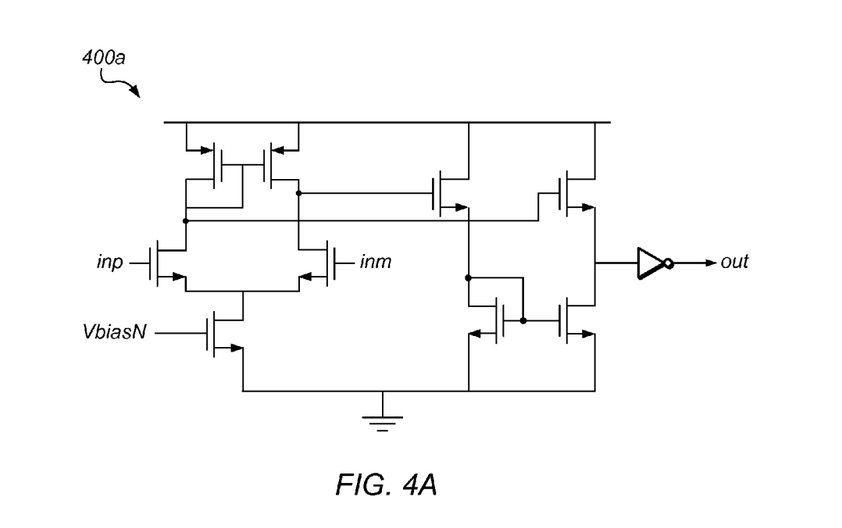
FIGS. 4A and 4B show transistor diagrams of two different comparator architectures.
Figure 4B:
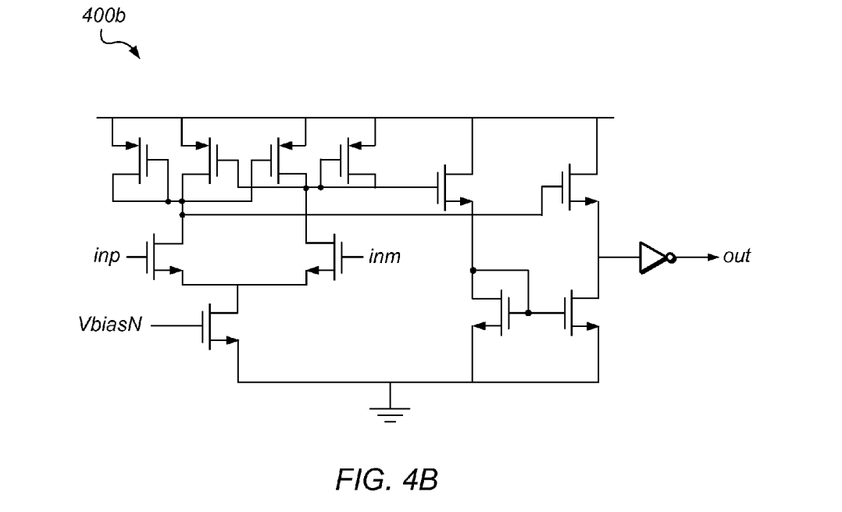

An important factor in designing the gain stages in the comparator may be power consumption. When the current of each stage is expected to be low, simple resistor loads may not be sufficient, since resistors on the order of MΩ may be required for generating currents in µA current range. Similarly, using active pMOS load and resistors between their gate and drain for bias may require a few hundred KΩ resistors to provide gain. FIGS. 4A and 4B show two possible comparator architectures 400*a* and 400*b*, respectively. In each case, 'inp' corresponds to the non-inverting node (e.g. the oscillator nodes of comparators 110 and 310), and 'inm' corresponds to the inverting node (e.g. the reference nodes of comparators 110 and 310). From comparator architecture 400*a* and comparator architecture 400*b*, comparator architecture 400*b* may be selected as more efficient, since it is more symmetric and may provide better supply rejection. The first order supply rejection may be zero since the variation will be common between LPO 100 and LPO 300 (or, specifically, between comparator 110 and comparator 310. Thus, while both comparator architectures 400*a* and 400*b* represent low-power comparators suitable for implementing the two-LPO design, comparator 440*b* may be more effective in achieving the desired goals due to its symmetry and better supply rejection.

Biasing Circuitry

Figure 5A:
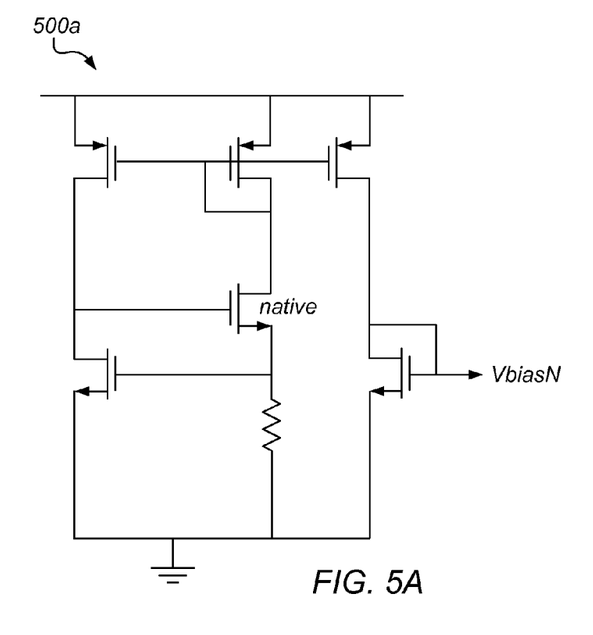
FIGS. 5A and 5B show transistor diagrams of two different embodiments of a biasing circuit for a comparator.
Figure 5B:
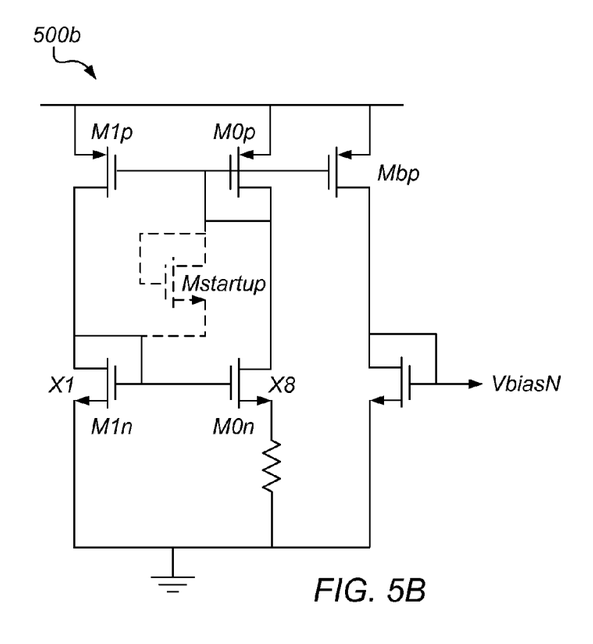

The circuits of LPO 100 and LPO 300 may be self-biasing, since they may operate even when the rest of the integrated circuit/chip (on which they may be configured) is off. One particular advantage of the two-oscillator approach presented herein is the independence of the temperature sensitivity of ΔT (difference of the periods of the two oscillators) from the comparator performance and the biasing circuitry. The sensitivity of T1 (period of oscillation of LFCLK$_1$ of LPO 100) and T2 (period of oscillation of LFCLK$_2$ LPO 300) may change significantly with the biasing circuit. FIGS. 5A and 5B show two different embodiments (500a and 500b) of a possible biasing circuit. The biasing output VbiasN corresponds to the VbiasN input shown in comparator circuits 400a and 400b. Biasing circuit 500a ($V_{gs}$/R biasing circuit) may provide good temperature dependency for ΔT, but it may result in less than ideal temperature sensitivities for T1 and T2. In order to improve the performance of each oscillator, biasing circuit 500b (constant-gm biasing circuit) shown in FIG. 5B may be used. By configuring the comparators with biasing circuit 500b, the respective temperature sensitivities of T1 and T2 may be reduced, while still operating with low power consumption. In one embodiment, biasing circuit 500b is configured with a start up circuit. As shown in FIG. 5B, transistor Mstartup may operate as the startup circuitry. The bias current may be determined by equation (Vgs1n=Vgs0n+ RI), which may feature two stable currents, a zero current and a non-zero current. The startup circuit may prevent the zero current by providing an additional current path through Mbp and M1n.

When the current increases, it may reach the second stable point, and the startup transistor Mstartup may turn off. Biasing circuit 500b may be configured to meet the following two conditions:

$$V_{dd} - V_{gs\_M0p} - V_{gs\_M1n} \leq V_{th\_Mstartup} \quad (6)$$

$$V_{th\_M0p} + V_{th\_Mstartup} + V_{th\_M1n} \leq V_{dd}. \quad (7)$$

The resistor types may be selected according to the given process technology that will be used for fabricating LPO 100 and LPO 300. For example, for a given TSMC (Taiwan Semiconductor Manufacturing Company) technology, nPoly resistors may be used because of their lower temperature sensitivity. Because in this technology nPoly and pPoly temperature coefficients may have opposite signs, a combination of nPoly and pPoly resistors may be used to achieve lower overall temperature sensitivities. One important parameter in selecting the oscillation capacitor may be the voltage sensitivity. Regular MOS capacitors may be overly sensitive to temperature variation. Using native MOS capacitors may reduce sensitivity to temperature variation, and using metal capacitors further may reduce sensitivity to temperature variation. The tradeoff may be the area of the metal capacitors. The effect of capacitance may be measured by configuring a first LPO using native-io capacitors, and configuring a second LPO, which is otherwise identical to the first LPO, using metal capacitors, and contrasting the behavior of the first LPO and the second LPO.

Divider resistors R2 and R3, and the input capacitor ($C_{osc}$) of the comparator may determine the settling time of the reference point (115 in LPO 100 and 315 in LPO 300). This time may be specified to be small enough for the reference node to settle down before the oscillator node (the non-inverting input into the comparator) approaches the reference voltage. On the other hand, use of small resistors may be limited by the power constraints. 1 MΩ resistors may result in 1.2 μA currents. The desired settling time may be achieved by reducing the size of the input capacitor of the comparator.

Adjusting the Output of One Oscillator Using the Output of the Other Oscillator

As mentioned above, the two-oscillator design disclosed herein may result in a stable ΔT (difference between the respective oscillation periods of the two LPOs) instead of a directly stable oscillation period T. Therefore, ΔT may be used to estimate time, enabling the use of the output of one LPO to calibrate or adjust the output of the other LPO. For example, LFCLK$_1$ may be used as the desired oscillator output, and LFCLK$_2$ may be used to calibrate/adjust LFCLK$_1$. In one set of embodiments, the two-oscillator system shown in FIG. 2 may include control circuitry (not shown) that may be configured to use LFCLK$_2$ to adjust LFCLK$_1$ based on ΔT. It should be mentioned again, that components 102, 104, 108, 110, 112, 116, and 120 in LPO 100 may be configured to be identical to the corresponding components 302, 304, 308, 310, 312, 316, and 320 in LPO 300. Those skilled in the art will appreciate that "identical components" refers to designing components with the intent of the components being identical, and that some slight differences between the actual fabricated components may exist within acceptable margins. Similarly, those skilled in the art will also appreciate that a frequency remaining substantially stable over variations in temperature does not necessarily mean that the frequency is wholly independent of variations in temperature, though in some specific embodiments that might be true, but more generally means that any variation in frequency due to variation in temperature may be minimal and reduced in scale when compared to the variation in temperature, and the frequency may remain well within an acceptable, small margin of error. The threshold of the voltages at the respective reference nodes 115 and 315 may be moved by selecting the values of resistors R2 and R3 (114 and 314, and 118 and 318, respectively), to achieve different oscillation periods for LPO 100 and LPO 300, while keeping resistors 108 and 308 at the same value, and keeping capacitors 104 and 304 at the same value.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a first oscillator having an output and comprising a first comparator having a first reference input, wherein the first oscillator is configured to generate a first low-threshold value and a first high-threshold value at the first reference input, to achieve an oscillation period of the first oscillator; and
   a second oscillator having an output and comprising a second comparator having a second reference input, wherein the second oscillator is configured to generate a second low-threshold value and a second high-threshold value at the second reference input, to achieve an oscillation period of the second oscillator;
   wherein in achieving the oscillation period of the first oscillator through the first low-threshold value and the first high-threshold value, and in achieving the oscillation period of the second oscillator through the second low-threshold value and the second high-threshold value, a difference between the oscillation period of the first oscillator and the oscillation period of the second oscillator remains substantially independent of variations in temperature; and
   wherein the first low-threshold value is higher than the second low-threshold value, and the first high-threshold value is lower than the second high-threshold value.

2. The system of claim 1, wherein the first comparator and the second comparator are of identical architecture.

3. The system of claim 1, wherein the first comparator and the second comparator each comprise a respective symmetric gain stage having high supply rejection.

4. The system of claim 1, wherein the first comparator and the second comparator each comprise a respective constant-transconductance biasing circuit.

5. The system of claim 1, wherein the oscillation period of the first oscillator is shorter than the oscillation period of the second oscillator.

6. A method for generating a periodic signal having a stable frequency, the method comprising:
generating a first periodic signal having a first frequency using a first oscillator;
generating a second periodic signal having a second frequency using a second oscillator; and
wherein said generating the first periodic signal and said generating the second periodic signal comprise maintaining a substantially temperature independent difference between the first frequency and the second frequency;
wherein said generating the first periodic signal comprises generating a first low-threshold value and a first high-threshold value at a first reference input of a first comparator comprised in the first oscillator, to achieve the first frequency;
wherein said generating the second periodic signal comprises generating a second low-threshold value and a second high-threshold value at a second reference input of a second comparator comprised in the second oscillator, to achieve the second frequency; and
wherein the first low-threshold value is higher than the second low-threshold value, and the first high-threshold value is lower than the second high-threshold value.

7. A system comprising:
a first oscillator comprising:
a first comparator having a first reference input, a first oscillator input, and a first output;
a first input capacitor coupled between a reference voltage and the first oscillator input;
a first feedback resistor coupled between the first oscillator input and the first output; and
a first resistor divider circuit coupled to the first reference input and configured to adjust a first reference voltage at the first reference input; and
a second oscillator comprising:
a second comparator having a second reference input, a second oscillator input, and a second output;
a second input capacitor coupled between the reference voltage and the second oscillator input;
a second feedback resistor coupled between the second oscillator input and the second output; and
a second resistor divider circuit coupled to the second reference input and configured to adjust a second reference voltage at the second reference input;
wherein an oscillation frequency of the first oscillator is determined by the first input capacitor, the first feedback resistor, and the first reference voltage;
wherein an oscillation frequency of the second oscillator is determined by the second input capacitor, the second feedback resistor, and the second reference voltage; and
wherein a difference between the oscillation frequency of the first oscillator and the oscillation frequency of the second oscillator is substantially stable over variations in temperature.

8. The system of claim 7, wherein the first input capacitor and the second input capacitor have the same value, and wherein the first feedback resistor and the second feedback resistor have the same value.

9. The system of claim 7, wherein the first comparator and the second comparator are identical.

10. The system of claim 7;
wherein the first oscillator further comprises first enable circuitry configured to enable and disable the first oscillator; and
wherein the second oscillator further comprises second enable circuitry configured to enable and disable the second oscillator.

11. The system of claim 10;
wherein the first enable circuitry comprises:
a first switch coupled across the first capacitor to pull the first oscillator node to the reference voltage when the first oscillator is disabled; and
logic gates configured to maintain a constant value at an output of the first oscillator when the first oscillator is disabled; and
wherein the second enable circuitry comprises:
a second switch coupled across the second capacitor to pull the second oscillator node to the reference voltage when the second oscillator is disabled; and
logic gates configured to maintain a constant value at an output of the second oscillator when the second oscillator is disabled.

12. The system of claim 7;
wherein the first resistor divider circuit comprises:
a first resistor coupled between the first reference input and the first output; and
a second resistor coupled between the first reference input and an output of the first oscillator; and
wherein the second resistor divider circuit comprises:
a third resistor coupled between the second reference input and the second output; and
a fourth resistor coupled between the second reference input and an output of the second oscillator.

13. The system of claim 7, wherein the first reference voltage is a periodic signal having a first minimum value and a first maximum value, wherein the second reference voltage is a periodic signal having a second minimum value and a second maximum value;
wherein the first maximum value is different from the second maximum value and the first minimum value is different from the second minimum value.

14. The system of claim 13, wherein the first minimum value is higher than the second minimum value, and wherein the first maximum value is lower than the second maximum value.

15. The system of claim 7, wherein the first oscillator and the second oscillator comprise identical components, with the exception of the first resistor divider circuit and the second resistor divider circuit.

16. A system comprising:
a first oscillator having an output and comprising a first comparator having a first reference input, wherein the first oscillator is configured to generate a first low-threshold value and a first high-threshold value at the first reference input, to achieve an oscillation period of the first oscillator; and
a second oscillator having an output and comprising a second comparator having a second reference input, wherein the second oscillator is configured to generate a second low-threshold value and a second high-threshold value at the second reference input, to achieve an oscillation period of the second oscillator;

wherein in achieving the oscillation period of the first oscillator through the first low-threshold value and the first high-threshold value, and in achieving the oscillation period of the second oscillator through the second low-threshold value and the second high-threshold value, a difference between the oscillation period of the first oscillator and the oscillation period of the second oscillator remains substantially independent of variations in temperature;

wherein the first oscillator and the second oscillator comprise identical components with the exception of a first resistor divider circuit comprised in the first oscillator and a second resistor divider circuit comprised in the second oscillator;

wherein the first resistor divider circuit is configured to determine the first low-threshold value and the first high-threshold value; and wherein the second resistor divider circuit is configured to determine the second low-threshold value and the second high-threshold value.

17. The system of claim 16, wherein the first comparator and the second comparator are of identical architecture.

18. The system of claim 16, wherein the first comparator and the second comparator each comprise a respective symmetric gain stage having high supply rejection.

19. The system of claim 16, wherein the first comparator and the second comparator each comprise a respective constant-transconductance biasing circuit.

20. The system of claim 16, wherein the oscillation period of the first oscillator is shorter than the oscillation period of the second oscillator.

* * * * *